United States Patent
Chan et al.

(10) Patent No.: US 9,171,786 B1
(45) Date of Patent: Oct. 27, 2015

(54) INTEGRATED CIRCUIT WITH RECESS FOR DIE ATTACHMENT

(71) Applicants: Soon Kang Chan, Petaling Jaya (MY); Soo Choong Chee, Shah Alam (MY); Stanley Job Doraisamy, Kuala Lumpur (MY); Dominic Koey, Kuala Lumpur (MY)

(72) Inventors: Soon Kang Chan, Petaling Jaya (MY); Soo Choong Chee, Shah Alam (MY); Stanley Job Doraisamy, Kuala Lumpur (MY); Dominic Koey, Kuala Lumpur (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/321,823

(22) Filed: Jul. 2, 2014

(51) Int. Cl.
| | |
|---|---|
| *H01L 23/48* | (2006.01) |
| *H01L 23/495* | (2006.01) |
| *H01L 23/00* | (2006.01) |
| *H01L 21/306* | (2006.01) |
| *H01L 23/498* | (2006.01) |

(52) U.S. Cl.
CPC .... *H01L 23/49513* (2013.01); *H01L 21/30604* (2013.01); *H01L 23/498* (2013.01); *H01L 24/06* (2013.01); *H01L 24/27* (2013.01); *H01L 24/32* (2013.01); *H01L 24/83* (2013.01); *H01L 2224/2741* (2013.01); *H01L 2224/32225* (2013.01); *H01L 2224/32245* (2013.01); *H01L 2224/83104* (2013.01); *H01L 2224/83201* (2013.01); *H01L 2924/14* (2013.01)

(58) Field of Classification Search
CPC ......... H01L 31/18; H01L 21/56; H01L 23/48; H01L 23/485
USPC .............................. 257/738, 782; 438/66, 113
See application file for complete search history.

(56) References Cited

U.S. PATENT DOCUMENTS

| | | | |
|---|---|---|---|
| 6,184,570 B1 | 2/2001 | MacDonald, Jr. et al. | |
| 7,042,103 B2 | 5/2006 | Condie et al. | |
| 8,456,023 B2 | 6/2013 | Bauer et al. | |
| 2008/0272479 A1* | 11/2008 | Bathan et al. | 257/690 |
| 2013/0037966 A1 | 2/2013 | Qiu et al. | |
| 2013/0344638 A1* | 12/2013 | Diep et al. | 438/66 |

FOREIGN PATENT DOCUMENTS

EP    1266399    8/2012

* cited by examiner

*Primary Examiner* — Evan Pert
*Assistant Examiner* — Changhyun Yi
(74) *Attorney, Agent, or Firm* — Charles E. Bergere

(57) ABSTRACT

An integrated circuit (IC) die has an active side and an inactive side, opposite the active side. A recess is formed within the interior of the inactive side and extends partially through the integrated circuit towards the active side. The IC die is part of a packaged IC device, where the die is attached to a package component such as a lead frame, substrate, or another die, using die attach adhesive that fills the recess, thereby providing a more reliable bond between the IC die and the package component.

7 Claims, 4 Drawing Sheets

INTEGRATED CIRCUIT WITH RECESS FOR DIE ATTACHMENT

BACKGROUND

The present invention relates generally to integrated circuit packaging, and, more particularly, to an integrated circuit structure that facilitates attaching the die to a substrate.

In a conventional packaged integrated circuit (IC) device, an IC die is typically mounted on and attached to another component of the IC device such as a lead frame flag (also referred to as a die paddle), a substrate, or another IC die. To mount and attach the IC die, a dispenser dispenses a controlled amount of a die attach adhesive onto the other component. Then, pick-and-place machinery presses the IC die into the die attach adhesive.

FIGS. 1A-1E show cross-sectional side views of a few different ways in which a conventional IC die 100 may be mounted on a lead frame flag 108 using a die attach adhesive 106. In general, the IC die 100 has an active side 102 having bond pads (not shown) disposed thereon and an inactive side 104 without bond pads. The pick-and-place machinery (not shown) places the IC die 100 on the die attach adhesive 106 such that the inactive side 104 of the IC die 100 is oriented toward the lead frame flag 108 and the active side 102 of the IC die 100 is oriented away from the lead frame flag 108 (i.e., facing up).

FIG. 1A shows the IC die 100 properly mounted properly on the lead frame flag 108. The amount of the adhesive 106 dispensed is sufficient to ensure that the adhesive 106 covers the entire inactive side 104 of the IC die 100 and only a small portion of the sides of the IC die 100. Further, the adhesive 106 does not have any air pockets or voids formed therein. The IC die 100 is positioned such that the inactive side 104 is substantially parallel to the upper surface of the lead frame flag 108. This ensures that the bond-line thickness (i.e., the die attach material thickness between the die's inactive side 104 and the upper surface of the flag 108) is substantially uniform across the entire area beneath the inactive side 104.

FIGS. 1B-1E illustrate a few of the issues that may arise when mounting the IC die 100 on the other component. In FIG. 1B, an insufficient amount of the adhesive 106 is dispensed onto the flag 108. As a result, when the IC die 100 is placed on the adhesive 106, the adhesive 106 does not cover the entire inactive side 104 of the IC die 100.

In FIG. 1C, the IC die 100 is pressed too far into the adhesive 106. As a result, the adhesive 106 extends up the sides of the IC die 100, and possibly contaminating the active side 102 of the IC die 100. Note that, whether or not the adhesive 106 extends up the sides of the IC die 100 is a function of the amount of adhesive 106 applied. Further, the bond-line thickness beneath the IC die 100 is small, which could adversely affect the reliability of the bond or possibly lead to cracking of the IC die 100 due to coefficient of thermal expansion (CTE) mismatch between the die 100, the adhesive 106, and the lead frame flag 108 during temperature cycling.

In FIG. 1D, the IC die 100 is mounted at an angle such that the inactive side 104 of the IC die 100 is not substantially parallel to the upper surface of the flag 108. As a result, the bond-line thickness is not uniform, which could adversely affect the reliability of the bond or possibly lead to cracking of the IC die 100 as discussed above.

In FIG. 1E, a void 110 is formed in the adhesive 106 when the IC die 100 is pressed into the adhesives 106. This void 110 could adversely affect the reliability of the bond between the IC die 100 and the flag 108, or possibly lead to electrical overstress. Accordingly, it would be advantageous to be able to mount and attach a die to another component in a manner that does not encounter the above-identified issues.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In the following description, it will be understood that certain embodiments of the present invention are related to integrated circuits, wafers from which the aforementioned integrated circuits are formed, and packaged integrated circuit (IC) devices assembled using the aforementioned integrated circuits. For ease of discussion, an exemplary packaged semiconductor device is discussed below in which an integrated circuit of the present invention is mounted onto a lead frame flag in a quad-flat no-lead (QFN) package. However, it will be understood that integrated circuits of the present invention may be assembled in packages other than QFN packages and may be mounted onto components other than lead frame flags, including (without limitation) other IC dies and substrates.

In one embodiment of the present invention, an article of manufacture comprises an integrated circuit device. The integrated circuit device comprises an IC die having an active side and an inactive side, opposite the active side. A recess is formed within an interior of the inactive side, and the recess extends partially through the integrated circuit toward the active side.

Figure 1A:
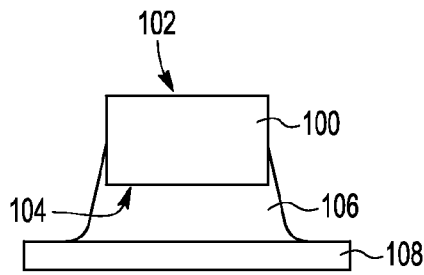
FIGS. 1A-1E show cross-sectional side views of a few different ways in which a prior-art IC die may be mounted onto a lead frame flag using a die attach adhesive.
Figure 1B:
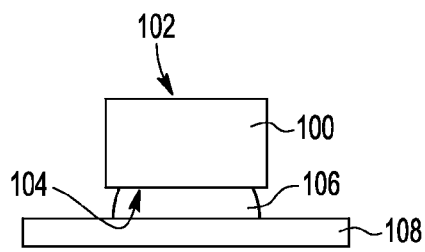
Figure 1C:
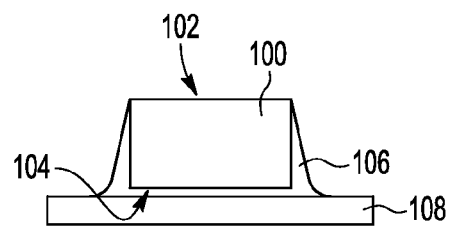
Figure 1D:
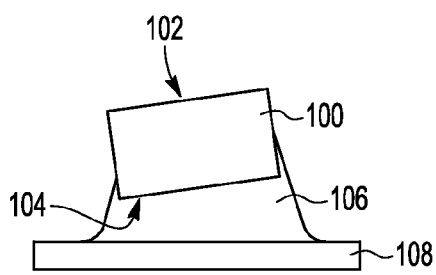
Figure 1E:
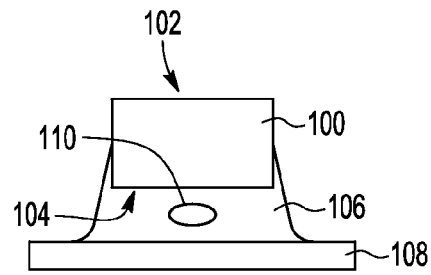
Figure 2:
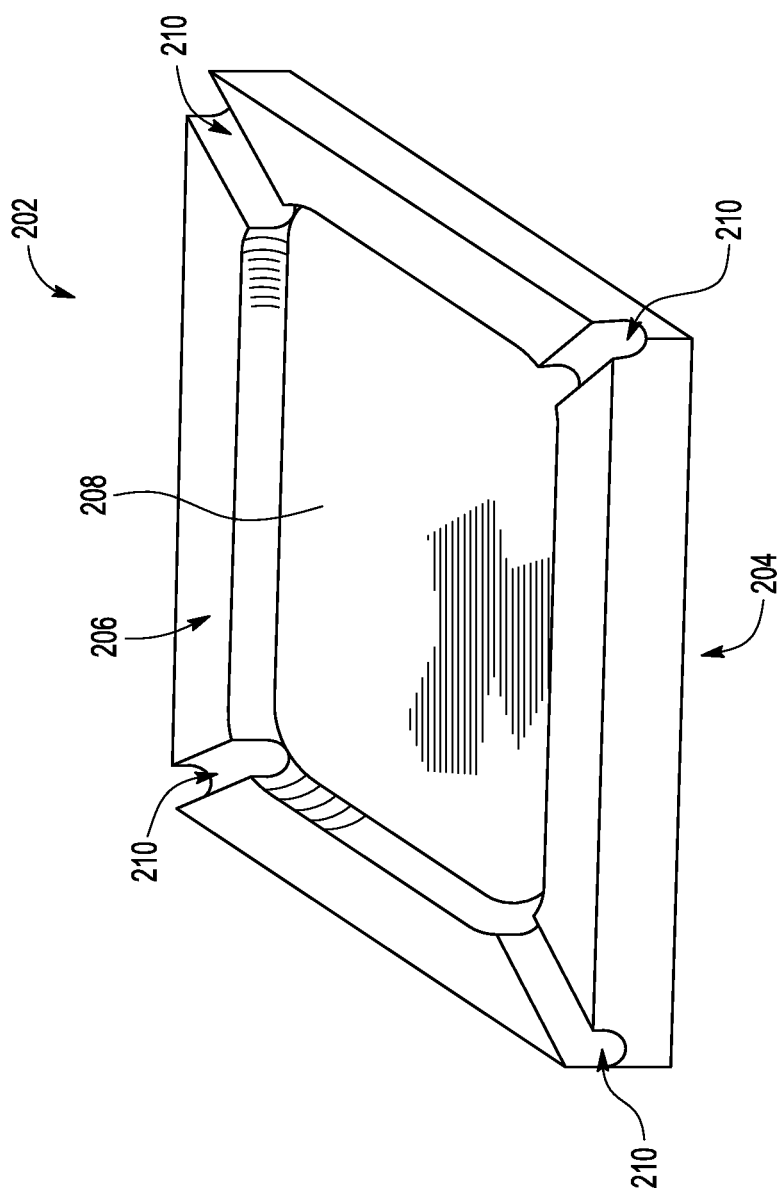
FIG. 2 shows a bottom perspective view of an individual integrated circuit (IC) die according to one embodiment of the present invention.

Referring now to FIG. 2, a bottom perspective view of an IC die 202 according to one embodiment of the present invention is shown. The IC die 202 has an active side 204 having bond pads (not shown) disposed thereon, and an inactive or back side 206 without bond pads. A recess 208 is formed in the inactive side 206 of the IC die 202 and extends partially through the IC die 202 toward the active side 204. In addition to the recess 208, the inactive side 206 also has four channels 210 formed therein. Each channel 210 extends from a different corner of the recess 208 to a different corner on the periphery of the IC die 202.

FIGS. 3A-3G show cross-sectional side views that illustrate steps of assembling a packaged IC device 228 according to one embodiment of the present invention. In this embodiment, the packaged IC device is a QFN packaged device. However, as discussed above, embodiments of the present invention are not limited to QFN packaged devices.

Figure 3A:
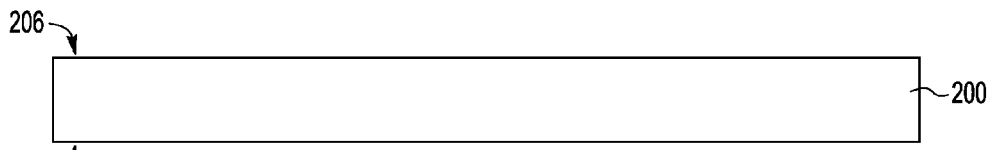
FIGS. 3A-3G show cross-sectional side views that illustrate steps of assembling a packaged IC device according to one embodiment of the present invention.

In FIG. 3A, an array of integrated circuits (not shown) are formed on a wafer 200 using known wafer fabrication techniques.

Figure 3B:
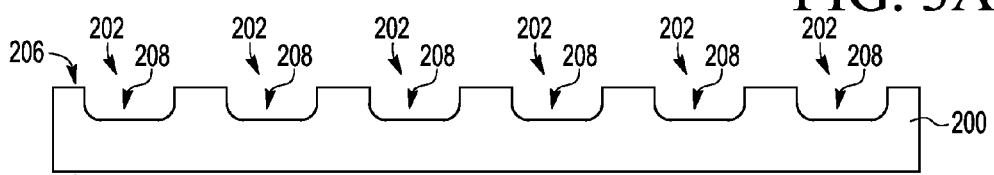

In FIG. 3B, a recess 208 and four channels 210 (shown in FIG. 2) are formed in the inactive side of the wafer 200 for each integrated circuit. Each recess 208 and each channel 210 may be formed using, for example, etching. In some embodiments, each recess 208 and each channel 210 may be formed using fast atom beam (FAB) etching. If a back-grinding process is used to reduce the thickness of the wafer 200, then the cavities 208 and channels 210 may be formed before or after performing the back grinding.

Figure 3C:
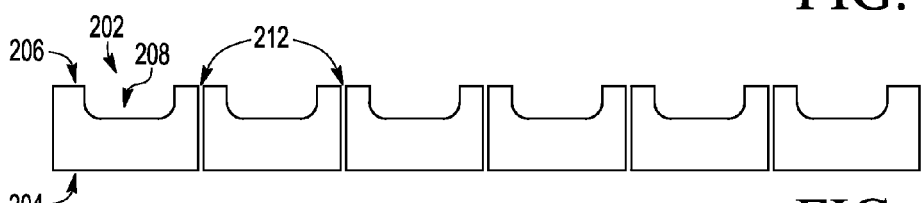

In FIG. 3C, sawing 212 is performed on the wafer 200 to separate the array of integrated circuits into individual IC dies 202, where each IC die 202 is configured as shown in FIG. 2.

Figure 3D:
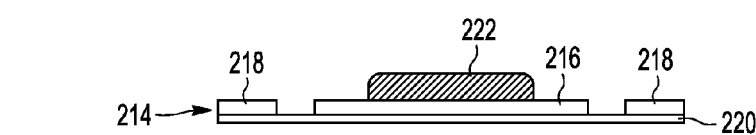

In FIG. 3D, a dispenser (not shown) dispenses a die attach material 222, such as (without limitation) an epoxy or solder paste, onto a lead frame 214. The amount of die attach material 222 dispensed is selected based on (i) the properties of the die attach material 222 and (ii) the size of the recess 208 in the IC die 202 that is to be mounted on the lead frame 214.

Although not shown, the lead frame 214 may be part of an array of interconnected lead frames upon which additional IC devices are to be assembled. The lead frame 214 comprises a lead frame flag 216, upon which the die attach material 222 is dispensed, and a plurality of metal leads 218. The lead frame 214 may also have tape 220 applied to the bottom thereof.

Figure 3E:
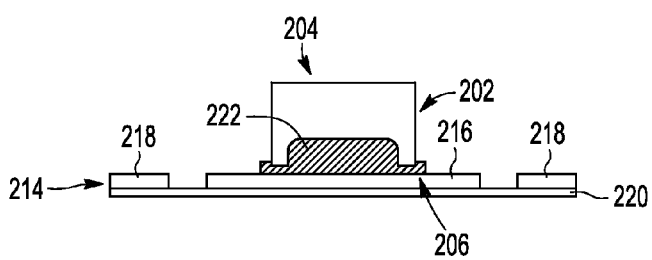

In FIG. 3E, pick-and-place machinery (not shown) places one of the IC dies 202 separated in FIG. 3C onto the die attach material 222 with the inactive side 206 facing the lead frame flag 216. As the IC die 202 is pressed onto the die attach material 222, the die attach material 222 fills the recess 208 and expands outward through the channels 210 (shown in FIG. 3). The expansion of the die attach material 222 outward through the channels 210 enables excess air and excess die attach material 222 to be removed from under the IC die 202. This reduces the likelihood that voids will form in the die attach material.

The recess 208 provides a stand-off from the upper surface of the lead frame flag 216. The depth of the recess 208 may be selected to ensure that, when the recess 208 is completely filled with the die attach material 222, the bond-line thickness extending from inside the recess to the upper surface of the lead frame flag 216 is sufficient. Thus, even if the pick-and-place machinery presses the IC die 202 too far into the die attach material 222, the die attach material 222 inside the recess will provide a sufficient and uniform bond-line thickness.

Figure 3F:
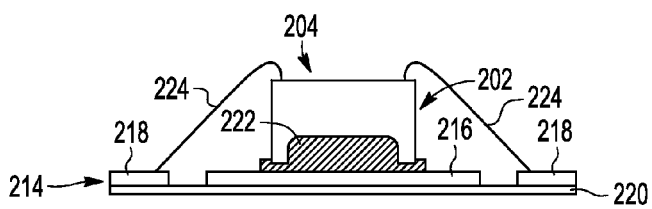

In FIG. 3F, the bond pads (not shown) on the active side 204 of the IC die 202 are wire-bonded to the metal leads 218 of the lead frame 214 using bond wires 224.

Figure 3G:
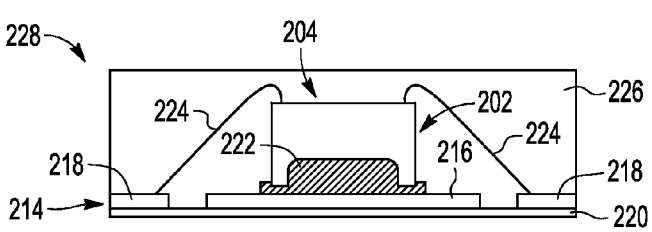

In FIG. 3G, the assembly comprising the IC die 202, the bond wires 224, and the upper surface of the lead frame 214 is encased in a molding compound 226 to form the packaged IC device 228. Although not shown, sawing could be performed to separate the packaged IC device 228 from other packaged IC devices (not shown) fabricated on adjacent lead frames (not shown) that are interconnected with the lead frame 214, and the tape 220 may be removed.

Although FIG. 3 shows a specific pattern formed by the recess 208 and the channels 210, embodiments of the present invention are not limited. According to alternative embodiments of the present invention, IC dies may have cavities and channels that form patterns other than that shown in FIG. 3. For example, the cavities may have shapes other than a rectangle such as other closed shapes, including (without limitation) circles and ovals.

In addition, IC dies of the present invention are not limited to having one recess and four channels extending from the one recess. In general, IC dies of the present invention may have one or more cavities and zero or more channels extending from each recess to a perimeter of the IC die. As an example, consider FIG. 4.

Figure 4:
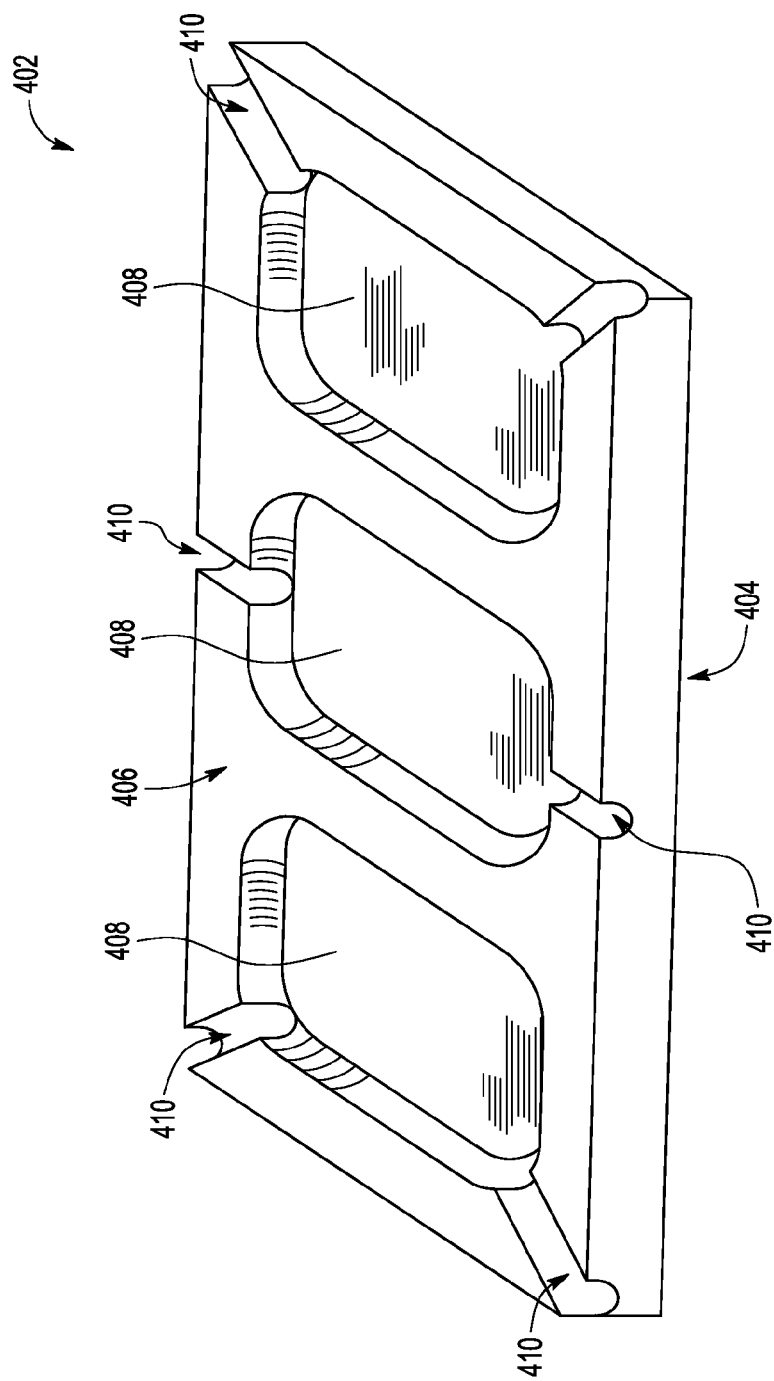
FIG. 4 shows a bottom perspective view of an IC die according to an alternative embodiment of the present invention.

FIG. 4 shows a bottom perspective view of an IC die 402 according to an alternative embodiment of the present invention. As shown, three cavities 408 are formed in the inactive side 406 of the IC die 402. Each recess 408 extends partially through the IC die 402 toward the active side 404. Further, each recess 408 has two channels 410 extending therefrom to the perimeter of the IC die 402. The cavities 408 and channels 410 may be formed using, for example, etching.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

The present invention can be embodied in the form of methods and apparatuses for practicing those methods.

It will be further understood that various changes in the details, materials, and arrangements of the parts which have been described and illustrated in order to explain the nature of this invention may be made by those skilled in the art without departing from the scope of the invention as expressed in the following claims. For example, in FIGS. 3D and 3E, rather than dispensing the die attach material 222 onto only lead frame flag 216, it will be understood that the die attach material 222 could be dispensed onto the lead frame flag 216 and/or the inactive side 204 of the IC die 202.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An integrated circuit die, comprising:
   an integrated circuit;
   an active side having bond pads in electrical communication with the integrated circuit;
   an inactive side, opposite the active side, wherein a recess is formed within an interior of the inactive side, the recess extending partially through the integrated circuit towards the active side; and
   at least one channel formed in the inactive side and extending from the recess to a periphery of the die.

2. The integrated circuit die of claim 1, wherein the die is packaged in a housing, thereby forming an integrated circuit device, the device comprising:
   the integrated circuit die; and
   a package component having a surface, wherein the inactive side of the die is mounted on said surface using a die attach material that substantially fills the recess.

3. The integrated circuit die of claim 1, wherein the die is formed on a wafer with a plurality of substantially identical other dies.

4. The integrated circuit die of claim 1, wherein the at least one channel comprises a plurality of channels formed in the inactive side and extending from the recess to a periphery of the die.

5. The integrated circuit die of claim 1, wherein a plurality of recesses are formed within an interior of the inactive side, the plurality of recesses extending partially through the die toward the active side of the die.

6. The integrated circuit die of claim 1, wherein the recess is formed by etching.

7. The integrated circuit die of claim 1, wherein the recess has a closed shape.

\* \* \* \* \*